United States Patent
Ino et al.

(10) Patent No.: US 8,012,315 B2
(45) Date of Patent: Sep. 6, 2011

(54) LANTHANOID ALUMINATE FILM FABRICATION METHOD

(75) Inventors: Tsunehiro Ino, Kanagawa (JP); Akira Takashima, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 920 days.

(21) Appl. No.: 11/966,304

(22) Filed: Dec. 28, 2007

(65) Prior Publication Data
US 2008/0271990 A1 Nov. 6, 2008

(30) Foreign Application Priority Data
Apr. 25, 2007 (JP) ................. 2007-115459

(51) Int. Cl.
*C23C 14/35* (2006.01)
(52) U.S. Cl. ......... 204/192.15; 204/192.17; 204/192.18; 204/192.21; 204/192.22; 204/192.25
(58) Field of Classification Search ............. 204/192.15, 204/192.17, 192.18, 192.22, 192.21, 192.25
See application file for complete search history.

(56) References Cited

U.S. PATENT DOCUMENTS
2004/0191646 A1 9/2004 Yoshikawa et al.
2005/0145957 A1* 7/2005 Ahn et al. ............ 257/410

FOREIGN PATENT DOCUMENTS
| JP | 8-325720 | 12/1996 |
|----|----------|---------|
| JP | 2003-224123 | 8/2003 |
| JP | 2003-234471 | 8/2003 |
| JP | 2004-318085 | 11/2004 |
| JP | 2005-139549 | 6/2005 |

OTHER PUBLICATIONS
U.S. Appl. No. 12/193,251, filed Aug. 18, 2008, Ino.
* cited by examiner

*Primary Examiner* — Rodney G McDonald
(74) *Attorney, Agent, or Firm* — Oblon, Spivak, McClelland, Maier & Neustadt, L.L.P.

(57) ABSTRACT

A method of fabricating by co-sputtering deposition a lanthanoid aluminate film with enhanced electrical insulativity owing to suppression of deviation in composition of the film is disclosed. Firstly within a vacuum chamber, hold two separate targets, one of which is made of lanthanoid aluminate ($LnAlO_3$) and the other of which is made of aluminum oxide ($Al_2O_3$). Then, transport and load a substrate into the vacuum chamber. Next, introduce a chosen sputtering gas into this chamber. Thereafter, perform sputtering of both the targets at a time to thereby form a lanthanoid aluminate film on the substrate surface. This film is well adaptable for use as ultrathin high dielectric constant (high-k) gate dielectrics in highly miniaturized metal oxide semiconductor (MOS) transistors.

15 Claims, 8 Drawing Sheets

LANTHANOID ALUMINATE FILM FABRICATION METHOD

CROSS-REFERENCE TO RELATED APPLICATION

This application is based upon and claims the benefit of priority from Japanese Patent Application No. 2007-115459, filed on Apr. 25, 2007, the entire content of which is incorporated herein by reference.

FIELD OF THE INVENTION

The present invention relates generally to fabrication technologies of dielectric thin-films for use in highly integrated semiconductor devices and, more particularly, to a method of forming a lanthanoid aluminate film which is excellent in electrical insulativity, i.e., dielectricity.

BACKGROUND OF THE INVENTION

As large-scale integrated (LSI) semiconductor circuit devices further advance in miniaturization, a need arises for an ultra-thin dielectric film capable of offering enhanced electrical insulation performances. In prior known LSI chips, a film of silicon oxide ($SiO_x$, where the suffix "x" is usually 2) has been widely used as a multi-purpose insulative film. However, in near future, it becomes inevitable to use several dielectric film materials in a way pursuant to respective on-chip circuit element functions in such LSI devices.

Dielectric films for use in the currently available ultralarge-scale integrated (ULSI) circuit chips include a gate insulating film of metal oxide semiconductor field effect transistors (MOSFETs), an insulator film between floating and control gates of a memory cell transistor in electrically erasable programmable nonvolatile semiconductor memory devices—for example, "Flash" memory of the floating gate type, an insulator film between charge trapping film and control gates of a memory cell transistor in electrically erasable programmable nonvolatile semiconductor memory devices—for example, "Flash" memory of the MONOS (metal oxide nitride oxide silicon) type, and a tunneling insulator film of a memory cell transistor in electrically erasable programmable nonvolatile semiconductor memory devices—for example, "Flash" memory of floating gate type or MONOS type or others. These dielectric films are generally required to have high dielectric constant (high-k) and low leakage current. A promising one of such dielectric films is a lanthanoid aluminate film, e.g., a lanthanum aluminate ($LaAlO_3$) film.

For fabrication of the lanthanoid aluminate film, studies have traditionally been made to employ pulsed laser deposition (PLD) and molecular beam epitaxy (MBE) or molecular beam deposition (MBD) methods. These film fabrication methods are inherently research-use processes, which are for preparing small-size samples slowly and carefully at increased costs. Thus, it does not appear that this approach is well adaptable for use in mass-production of the film. From a viewpoint of industrial applications, it is desirable to use sputtering techniques. This can be said because the sputtering is readily applicable to the manufacture of large-size workpieces at low costs while reducing complexities in process designs.

A sputtering method of forming a high-k dielectric film, e.g., silicate film, for use in ULSI devices is disclosed in JP-A 2003-234471(KOKAI). A ferroelectric film manufacturing method is found in JP-A 2003-224123(KOKAI).

SUMMARY OF THE INVENTION

An attempt was made by the inventors as named herein to fabricate by sputter deposition an ultrathin film of lanthanum aluminate ($LaAlO_3$), which is one of lanthanoid aluminates. In this sputtering, a single target was used, which is made of the same material as that of such film being fabricated—i.e., $LaAlO_3$. However, the lanthanoid aluminate film thus formed by this single-target sputtering suffers from a problem: the level of a leakage current is so high that the film is hardly applicable to ULSI device products.

One main reason of this is as follows. In case the single $Al_2O_3$ target is used, electrons behave to attach to oxygen which is large both in electro-negativity and in electron affinity since the lanthanum is less in electronegativity. Thus, the generation rate of negative oxygen ions becomes higher at or near the surface of the sputtering target. This increase of negative ions induces composition deviation of the lanthanoid aluminate film that is formed on a substrate, resulting in an increase in leakage current.

More specifically, when negative oxygen ions are generated at high generation rate, these ions are accelerated by the voltage potential of a sheath adjacent to the target in a plasma to have an extra-high energy of several million degrees or above. The negative oxygen ions per se are as less as several milliseconds in half-value period. Thus, most negative oxygen ions exhibit dissociation into neutral oxygen particles and electrons after the acceleration by the sheath voltage. However, the extra-high kinetic energy and momentum of the negative oxygen ions are passed to and retained by the dissociated neutral oxygens in accordance with the law of conservation of momentum. This results in generation of neutral oxygen that is high in energy and in momentum. A high-rate beam of such neutral oxygen and remaining negatively ionized oxygen has its kinetic momentum in a vertical direction with respect to the target surface. Upon irradiation of such high-energy/high-momentum particles onto the substrate with the $LaAlO_3$ film being presently formed thereon, this can damage not only the $LaAlO_3$ film deposited thereon per se but also the substrate beneath the $LaAlO_3$ film.

The energy of oxygen beam originating negative oxygen ion is as high as several million degrees or more; so, atomic motions of lanthanum and aluminum plus oxygen, which are sputtered by plasma particles of positive argon ion or others from target and have relatively low energy level of hundred-thousand degrees, are derived in a $LaAlO_3$ film that has experienced the incoming radiation of the oxygen beams and derived cascade shower of relatively low energy particles between several million degrees and hundred-thousand degrees. This would result in selective ejection or "evaporation" of aluminum atoms from the film, which are less in weight than lanthanum atoms. This selective aluminum evaporation is also occurred and facilitated by the fact that aluminum oxides are about 3000° C. in boiling point, which is lower than that of lanthanum oxides—i.e., 4200° C. In this way, the $LaAlO_3$ film being formed on the substrate is encountered with unwanted occurrence of composition deviation, resulting in a likewise increase in leakage current of the film.

It is therefore an object of this invention to provide a new and improved method of making a lanthanoid aluminate film excellent in electrical insulativity or dielectricity by suppressing the composition deviation of the film formed by sputter deposition.

In accordance with one aspect of the invention, a lanthanoid aluminate film fabrication method includes, holding within a vacuum chamber a first target made of lanthanoid aluminate ($LnAlO_3$) and a second target made of aluminum oxide ($Al_2O_3$), conveying a substrate into the vacuum chamber, introducing a sputtering gas into the vacuum chamber, and sputtering the first and second targets at a time to thereby form a lanthanoid aluminate film on the substrate.

According to this invention, it becomes possible to suppress or minimize film composition deviation occurring due to execution of a sputtering process. This makes it possible to fabricate an ultrathin lanthanoid aluminate film with improved dielectric performance.

DETAILED DESCRIPTION OF THE INVENTION

In the description of a currently preferred embodiment of this invention, the term "lanthanoid aluminate" as used herein refers to composite oxide of aluminum and lantanoid element. Examples of the lanthanoid are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) and yttrium (Y).

Additionally in the description below, the leakage current of a lanthanoid aluminate film is represented by the magnitude of an electric field being applied thereto, which in turn is given as an equivalent oxide thickness (EOT)-converted electric field. To determine the EOT electric field, first convert the thickness of a film under evaluation into a thickness of silicon oxide ($SiO_x$) film having its dielectric constant k equivalent thereto. Then, subtract a flat-band voltage from the voltage being applied to the lanthanoid aluminate film to thereby obtain a difference voltage. Next, divide this difference voltage by the $SiO_x$ film thickness value calculated, and define the resultant value as the EOT electric field.

A gate insulator film of metal oxide semiconductor field effect transistors (MOSFETs), an insulative film sandwiched between floating and control gates of flash memories, and an insulative film of blocking layer sandwiched between charge accumulation layer and control gate of metal oxide nitride oxide semiconductor (MONOS) type flash memories are required to be high in dielectric constant k (i.e., high-k) and, at the same time, low in leakage current. Accordingly, by evaluating a leakage current with the EOT-converted electric field as its index, it becomes possible to properly judge the applicability and usability of such film. In the description of a currently preferred embodiment of this invention, the term "composition ratio" means "moler ratio".

In case a film of lanthanum aluminate, which is one of lanthanoid aluminates, is formed by sputter deposition, an attempt was first made to perform sputtering from a single or "mono" target that is made of lanthanum aluminate ($LaAlO_3$). However, with mere use of the $LaAlO_3$ mono-target, it was hardly possible to sufficiently suppress the occurrence of leakage current flow of the resultant film as stated previously.

One reason of the film leakage current increase is that the $LaAlO_3$ film deviates in composition ratio due to the incoming radiation of a high-energy beam of neutral oxygen in large part as produced during sputtering. More specifically, upon irradiation of the high-energy neutral oxygen beam, aluminum is selectively evaporated from the surface of $LaAlO_3$ film whereby the composition of this film is deviated from that inherent to $LaAlO_3$ so that the molar ratio of aluminum (Al) to lanthanoid (Ln) in the film becomes less than 1. This Al/Ln ratio reduction results in an increase in leakage current.

To avoid the composition deviation, an attempt was made to form the $LaAlO_3$ film by a co-sputtering process using a couple of targets—that is, a target made of lanthanum oxide ($La_2O_3$) and a target made of aluminum oxide ($Al_2O_3$)—in place of the $LaAlO_3$ mono-target. However, this approach is faced with a problem as to occurrence of target collapse or decay. It appears that this target decay is resulted from crystal expansion occurring due to an accelerated change of $La_2O_3$ to lanthanum hydroxides or lanthanum carbonate hydrates by absorption of a moisture and carbon dioxide ($CO_2$) in the atmospheric air.

Even though a technique is used for minimizing atmospheric air exposure of the $La_2O_3$ target, the moisture and $CO_2$ gas are still absorbable into the target surface. When using such the target for pre-sputtering or sputtering, carbon components that are originated from the $CO_2$ gas in the air are knocked-on deeper into the $La_2O_3$ target by collision shock received from a sputtering gas used, such as argon (Ar) gas. This carbon "invasion" contaminates the lanthanum aluminate ($LaAlO_3$) film fabricated.

In view of this point, an attempt was next made to perform chemical sputtering by use of a lanthanum metal target and an aluminum metal target in an oxygen-containing sputter gas atmosphere. This approach, however, suffers from a more serious problem as to further exacerbated target decay. It is likely that this occurred because the lanthanum metal is as high in reactivity as alkali metals.

Furthermore, an attempt was made to perform film fabrication using a mono-target made of lanthanum aluminate ($LaAlO_3$), which has the molar composition ratio of lanthanum (La) to aluminum (Al) which was designed in advance so that Al is larger in content than La. Unfortunately it was revealed that the stable target can make only from single phase composite oxides of lanthanum oxide ($La_2O_3$)-aluminum oxide ($Al_2O_3$) system, which exists only when setting a very limited range of composition ratios—more precisely, a composition ratio of Al:La=11:1 (beta structure), Al:La=1:1 (perovskite structure) or Al:La=7:33, which is known as "7:33" phase or R phase.

In cases where the target used is with setup of intermediate composition ratios other than these three specific phases, there must occur a problem similar to that in the case of using the $La_2O_3$ target stated supra, i.e., the penalty of target decay due to crystal expansion.

This target decay is due to the presence of residual unreacted lanthanum oxides ($La_2O_3$). In other words, $La_2O_3$ other than those used to form the perovskite structure behaves to reside continuously in the target having a La-increased composition ratio, thus giving rise to the target decay. Alternatively, the target with Al-increased composition ratios decays due to the remanence of $La_2O_3$ that failed to form the perovskite structure. Another cause of the decay is that lanthanum-doped aluminum oxides ($Al(La)_2O_3$) have a structure high in content of voids and thus absorb moisture in the air so that these oxides are unintentionally converted to aluminum hydroxides.

The experiment and evaluation results have revealed that a preferable approach to suppressing the composition deviation of the $LaAlO_3$ film is to employ a co-sputtering process with the co-use of two separate targets, one of which is made of $LaAlO_3$ and the other of which is made of $Al_2O_3$.

Figure 1:
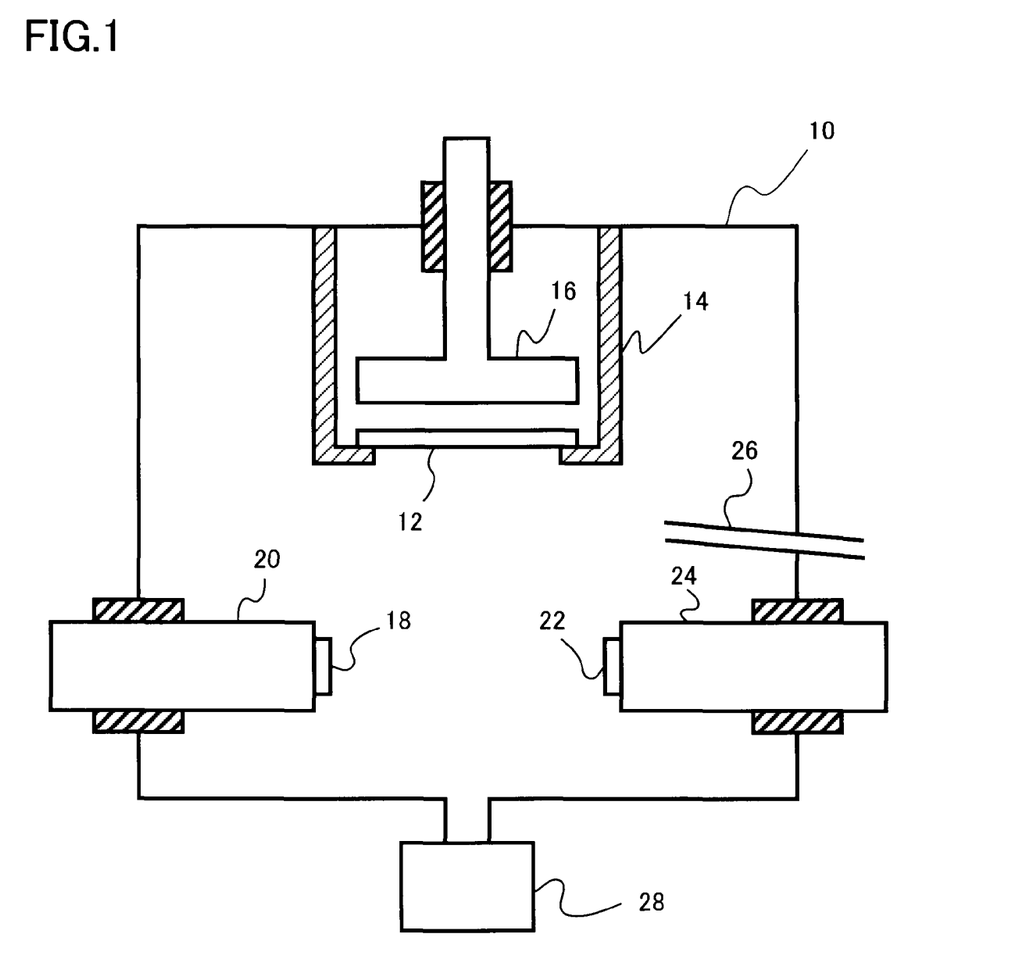
FIG. 1 illustrates, in cross-section, a basic structure of a sputtering apparatus for use in the manufacture of a lanthanoid aluminate film in accordance with one embodiment of this invention.

See FIG. 1, which illustrates schematically a basic configuration of a sputtering apparatus suitably used for the lanthanoid aluminate film fabrication method embodying the invention. The illustrative sputtering tool includes a vacuum chamber 10, a rotation mechanism 14 which is driven to rotate while at the same time stably supporting thereon a substrate 12 loaded into the chamber 10, and a heater module 16 for heating the substrate 12. A sputtering cathode electrode 20 is provided to hold and retain a first target 18 and also to apply thereto electrical power of radio-frequency (RF). Another sputtering cathode 24 is for holding a second target 22 and for applying RF power thereto. A gas inlet pipe 26 is provided between the substrate 12 and the targets 18 and 22, for feeding a chosen sputtering gas into the interior space of vacuum chamber 10. An evacuation pump 28 is provided to exhaust gasses from the inner space of chamber 10.

Within the vacuum chamber 10 one or more magnets (not shown) are disposed for creating a magnetic field, which is applied to a space between the substrate 12 and the targets 18 and 22. Using this arrangement enables achievement of RF magnetron sputtering. Targets 18 and 22 are spatially laid out so that each is slanted or angled relative to the substrate 12. This is called the "off-axis" layout.

A film of lanthanum aluminate ($LaAlO_3$), which is an example of the lanthanoid aluminate, is formed in a way which follows. What is done first is to prepare the targets 18 and 22, wherein target 18 is made of lanthanum aluminate ($LaAlO_3$) whereas target 22 is made of aluminum oxide ($Al_2O_3$) Then, place the $LaAlO_3$ target 18 in the vacuum chamber 10 so that it is stably mounted on the sputtering cathode 20. Similarly set the $Al_2O_3$ target 22 on its corresponding sputter cathode 24. The substrate 12 is also prepared. An example of this substrate is a single-crystalline silicon (Si) wafer of n-type conductivity, which has its top surface equivalent to a (100) crystal plane.

Then, apply a cleaning process to the Si wafer 12 by using a diluted hydrofluoric acid solution, thereby to remove a native-oxide film on the wafer surface. Thereafter, transport the Si wafer 12 and load it into the vacuum chamber 10. Si wafer 12 is then stably held by the rotation mechanism 14. The surface of $LaAlO_3$ target 18 to be laid out in such a way as to form a prespecified angle θ of ninety (90) degrees relative to the surface of Si wafer 12 mounted. Similarly, apply position alignment to $Al_2O_3$ target 22 so that its surface forms the angle θ of 90 degrees with the wafer surface.

Figure 2:
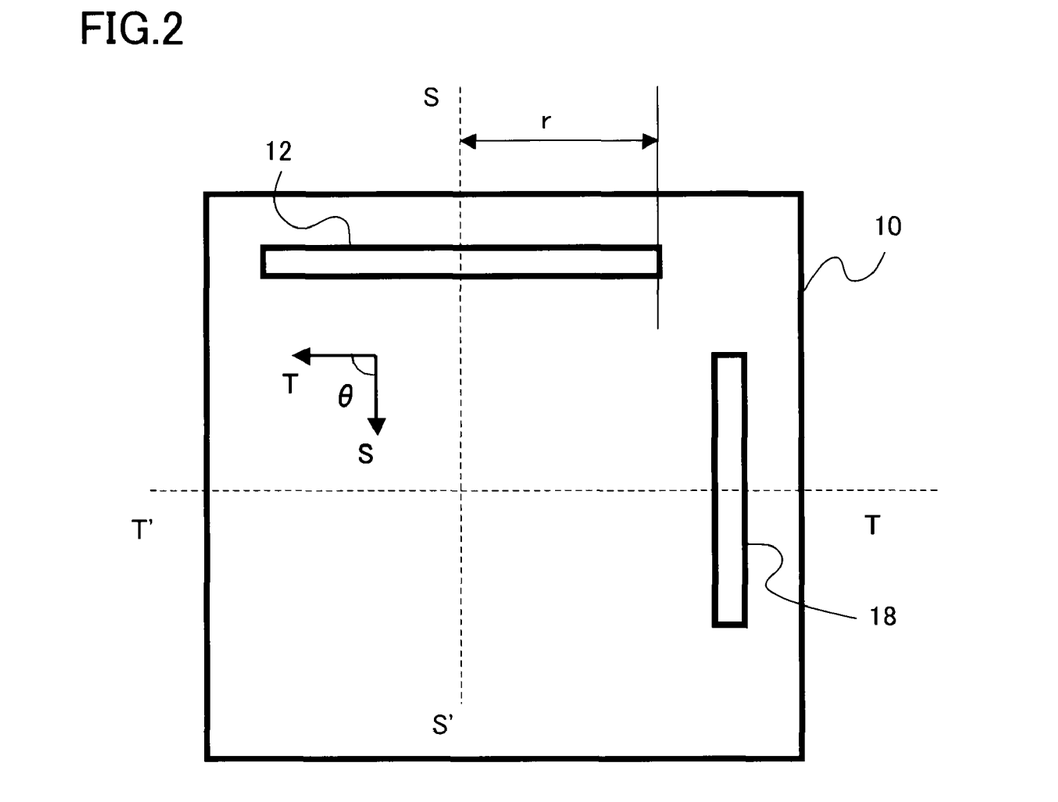
FIGS. 2 and 3 are diagrams schematically showing different sectional views of a vacuum chamber used in the sputtering apparatus of FIG. 1 for indicating a spatial layout relationship of target and substrate surfaces.
Figure 3:
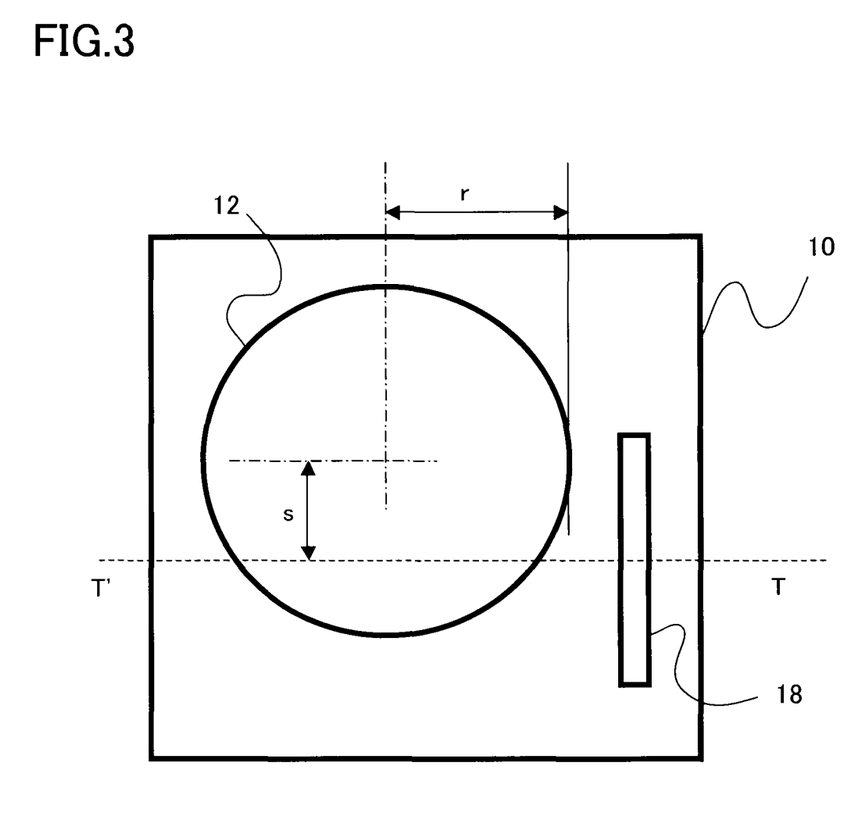

Referring to FIGS. 2 and 3, one typical layout example is shown for explanation of the spatial positioning relationship between the Si wafer surface and the surface of one target. FIG. 2 illustrates a sectional view of the vacuum chamber 10 in a direction normal to Si wafer 12 whereas FIG. 3 depicts a sectional view of chamber 10 in a direction parallel to Si wafer 12. It should be noted that only one of the $LaAlO_3$ target 18 and $Al_2O_3$ target 22—here, target 18—is shown in FIGS. 2-3 for purposes of convenience in illustration. The same goes with the remaining $Al_2O_3$ target 22 as far as the surface positioning is concerned.

As shown in FIG. 2, the Si wafer 12 has a thin round disk-like shape with a radius "r" (in millimeters). The target/wafer surface angle θ is defined by a vector T which is at right angles to the target surface and extends in a direction of from the back face to top surface of $LaAlO_3$ target 18 and a vector S that is normal to the wafer surface and extends in a direction of from the backface to top surface of Si wafer 12. The angle θ is equal to an angle between these vectors T and S.

Figure 4:
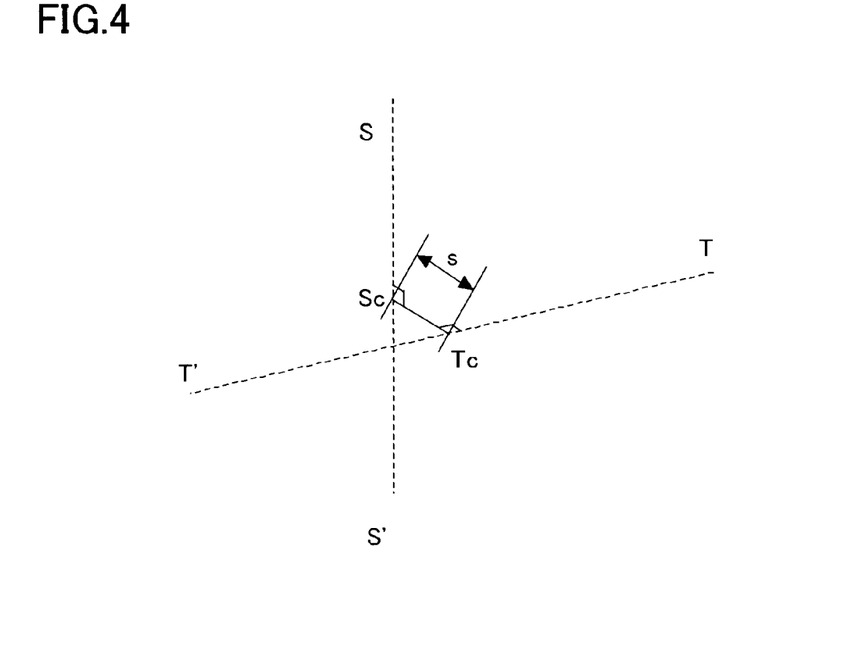
FIG. 4 is a diagram showing model for explanation of the spatial layout relation of the target and substrate surfaces.

As shown in FIG. 4, the $LaAlO_3$ target 18 is disposed relative to the Si wafer 12 so that a line segment TT' which is virtually extended from the center of mass (or the gravity point) of $LaAlO_3$ target 18 does not cross a line segment SS' that is virtually extended vertically from the gravity point of wafer 12; more precisely, line TT' is in twisted parallel with line SS'. However, line TT' can cross line SS' in appropriate case. At this time the minimum distance between lines TT' and SS'—i.e., a distance between points Tc and Sc in FIG. 4—is set to s1 (mm). s1 (mm) can be 0 (mm) in the appropriate case. This distance setting is similarly applicable to the other $Al_2O_3$ target 22: let its minimum distance be s2 (mm).

Figure 5:
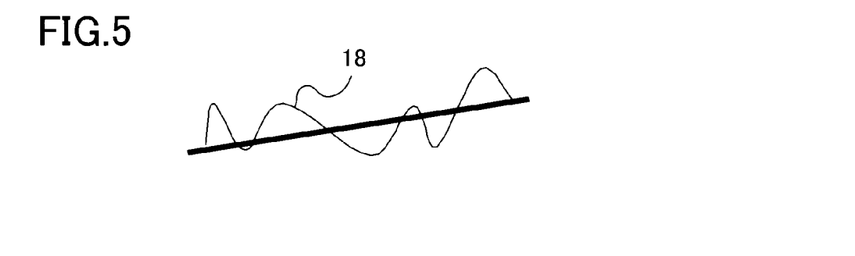
FIG. 5 and FIG. 6 schematically showing cross-section of target surface and substrate surface, respectively.

The target may have various shapes, for example—a plate-like, a cylinder-like, a sphere-like, a waved-plate-like, a concentric waved-plate-like, a fan-like, a sphere-core-like, a rectangular parallelepiped-like, a disk-like. If the surface of $LaAlO_3$ target 18 is not a completely flat plane, a flat approximate surface of the target obtained by the method of least squares is used. Data points for the method are selected from the actual surface of the target evenly and as many as possible for better approximation. An example is shown in FIG. 5, wherein the actual surface of the target is waved irregularly and the approximate surface of the target which is a flat plane obtained from the model is indicated by a thick line. The same goes with the $Al_2O_3$ target 22.

Figure 6:
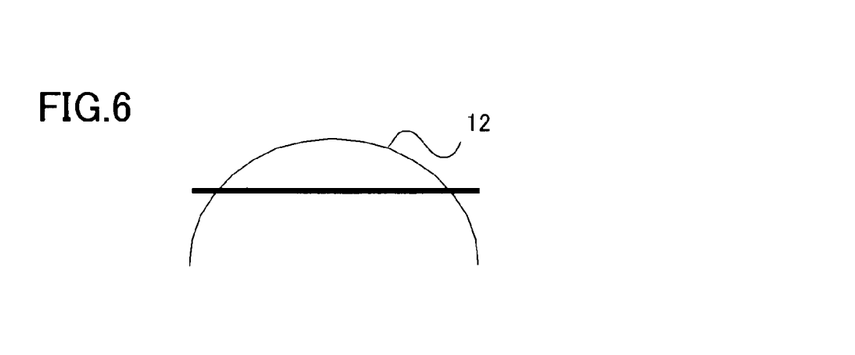

A substrate, e.g. Si wafer, may also have various shapes, for example—a plate-like, a cylinder-like, a sphere-like, a waved-plate-like, a concentric waved-plate-like, a sphere-core-like, a rectangular parallelepiped-like, a disk-like. If the surface of Si wafer 12 is not completely flat, use a surface model that approximates the actual wafer surface. Similar model used to define the approximate surface of the target can be applicable for defining the approximate surface of the substrate. An example is shown in FIG. 6, wherein the actual surface of the substrate is of a hemispherical shape and the approximate surface of the substrate which is a flat plane obtained from the model is indicated by a thick line.

After having disposed the loaded Si wafer 12 to satisfy the above-stated positional relationship for the $LaAlO_3$ target 18 and $Al_2O_3$ target 22, apply sputtering to these targets at a time to thereby deposit a $LaAlO_3$ film on the surface of wafer 12. Typical process conditions at this film fabrication step are as follows:

Vacuum of chamber: $1\times10^{-8}$ Pa
Wafer radius: 150 mm
Wafer/target angle θ: 90 degrees
Minimum $LaAlO_3$ target-wafer distance s1: 100 mm
Minimum $Al_2O_3$ target-wafer distance s2: 100 mm
$LaAlO_3$ target radius R1: 32 mm
$Al_2O_3$ target radius R2: 27.5 mm
Sputter gas: mixture of Ar and $O_2$ gases
Total gas pressure: 1.0 Pa
Partial $O_2$ pressure: $1.0\times10^{-3}$ Pa
Wafer temperature: 600° C.
RF power of $LaAlO_3$ target: 50 W RF power of Al₂O₃ target: 33 W
Film thickness: 22 nm
Film forming rate: 0.025 nm/sec.
Film growth time: 880 sec.
Wafer spin rate: 0.3 turns/sec.
Wafer rotation speed: 0 turns/sec.

In the LaAlO₃ film forming process under the exemplary conditions stated above, prior to introducing the sputter gas into the vacuum chamber 10, the vacuum pump 28 of FIG. 1 is driven to perform evacuation so that the inside space of chamber 10 is kept at the above-noted level of a vacuum. Thereafter, the sputter gas of Ar is fed thereinto from the gas inlet pipe 26.

Then, activate the sputter cathodes 20 and 24 to apply RF power with the values stated supra to the LaAlO₃ target 18 and Al₂O₃ target 22. While appropriately controlling the ratio of RF power to cathode 20 versus RF power to cathode 24, adjust the molar ratio of Al to La of the lanthanum aluminate (LaAlO₃) film being formed directly on Si wafer 12. In this way, the LaAlO₃ film obtained has its Al/La ratio of 1.00±0.02 as an example, wherein the value 0.02 is a practically allowable measurement error.

Additionally, an oxygen (O₂) gas is also introduced into the vacuum chamber 10 by another gas inlet pipe (not shown in FIG. 1); then, control is provided to ensure that the partial pressure of O₂ gas is set at the aimed value stated above. The feed rates of Ar and O₂ gases and the gas exhaust amount of vacuum pump 28 are adjusted to thereby control the total pressure of the sputtering gas (here, also including the partial pressure of O₂) so that this is set to the above-identified value. Si wafer 12 is heated by heater 16 so that it is kept at a temperature of the above-noted value. Control of the spin rate is done by the rotation mechanism 14 shown in FIG. 1.

Figure 7:
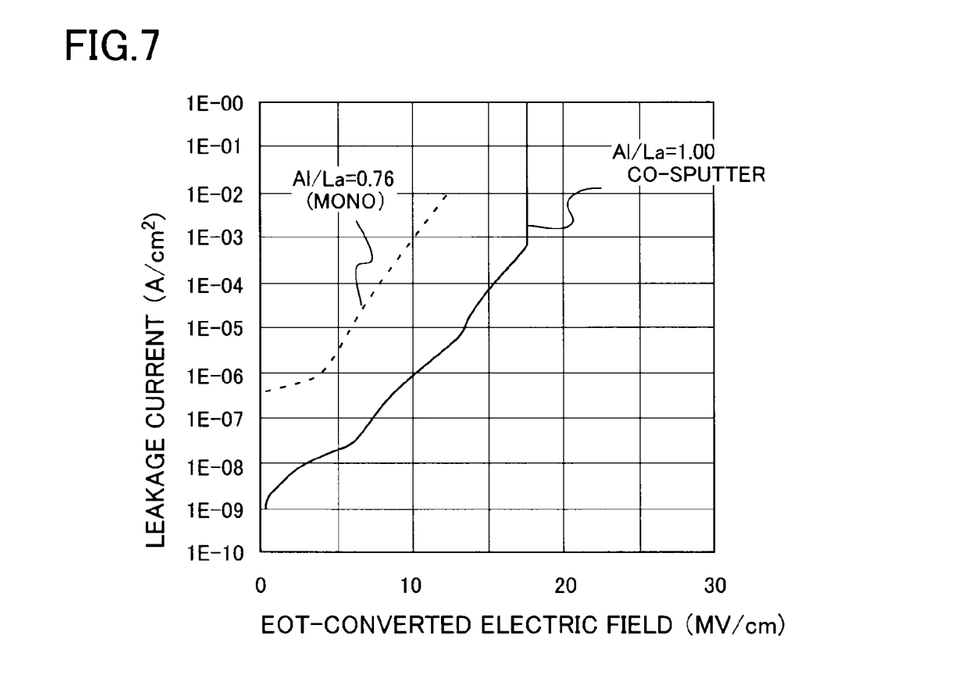
FIGS. 7 through 10 are graphs showing curves of leakage current of lanthanum aluminate film versus effective oxide thickness (EOT)-converted electric field for various process parameters, including film composition ratio, temperature, and partial pressure of oxygen.

See FIG. 7, which is a graph showing leakage characteristics of the lanthanum aluminate (LaAlO₃) film thus formed under the process conditions stated supra—that is, a curve of leakage current per unit area versus EOT-converted electric field. For comparison purposes, the characteristic curve of a LaAlO₃ film is also shown, which was formed by prior known method with the aid of a single or "stand-alone" LaAlO₃ target at room temperature. This comparative LaAlO₃ film sample is 0.76 in molar Al/La ratio. As apparent from the graph of FIG. 7, the LaAlO₃ that was formed by the cosputtering method embodying the invention is noticeably lowered in leakage current and thus offers enhanced electrical insulation performance.

One factor that contributes to reduction of the leakage current lies in suppressing deviation of Al/La composition of the LaAlO₃ film fabricated. To verify this, several film samples of different molar Al/La composition ratios were prepared for measurement of leakage current characteristics thereof. Measurement results are graphically shown in FIG. 8—namely, leakage characteristics of samples with Al/La composition ratios of 1.00 and 1.19 which were fabricated by the embodiment cosputtering method along with the leak characteristics of a comparative sample with its Al/La composition ratio of 0.76 which was formed using the monotarget, which is similar to that of FIG. 7. These samples were set at the same wafer temperature during sputter deposition. The Al/La ratio of every sample was adjusted by control of the sputter cathode RF power ratio.

Figure 8:
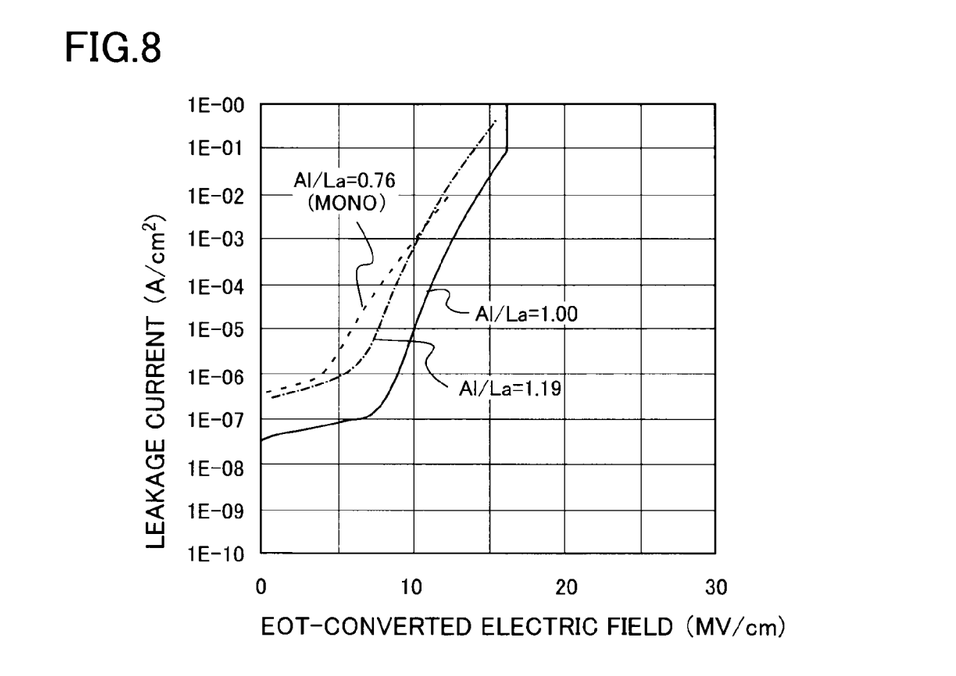

As apparent from viewing the graph of FIG. 8, by increasing the mono-target's molar Al/La composition ratio by use of the embodiment cosputtering method from 0.76 to 1.0 and to 1.19, the resulting LaAlO₃ film was appreciably suppressed in leakage current flowable therein. Note however that when setting the molar Al/La ratio at a value greater than 1, e.g., 1.19, the leakage current suppressibility was decreased by little. From these experiment results, it has been made sure that in order to successfully reduce the occurrence of leakage current with respect to the applied voltage, it is preferable to set the LaAlO₃ film's Al/La ratio to fall within the range of from about 0.98 to about 1.19. More preferably, the ratio is set to range from 0.98 to 1.02. With this ratio setup, it is possible to further reduce the leakage current relative to the voltage applied.

Letting the Al/La ratio come close to 1 in this way results in avoidance of the composition deviation of LaAlO₃, thereby making it possible to form the intended perovskite structure with increased stability in film quality. Accordingly, the dielectric constant k increases in value. This leads to reduction of a leakage current otherwise occurring due to imperfectness of crystallinity. Thus the leakage current with the EOT-converted electric field as its index or "barometer" is suppressed. In addition, while an increase in Al's composition ratio tends to cause the LaAlO₃ film to expand in its band gap, it is considered that this band gap expansion also contributes to the suppression of the leakage current.

Although in this embodiment the sputter deposition is performed by the off-axis layout scheme with the Si wafer 12 being disposed so that its surface is angled at 90 degrees with respect to each of the LaAlO₃ target 18 and Al₂O₃ target 22, this wafer may alternatively be laid out so that its surface opposes vis-a-vis each target. In other words, each target 18, 22 is at an angle θ of 180 degrees relative to Si wafer 12 when the need arises. In this case, however, wafer can accompany the risk of incoming radiation of an increased amount of high-energy neutral oxygen beam. This irradiation beam increase results in acceleration of selective evaporation of aluminum, thereby making it difficult to control the molar Al/La composition ratio. Additionally the irradiation of high-energy neutral oxygen beam can result in creation of defects in the LaAlO₃ film fabricated, resulting in an increase in leakage current.

By taking these risks into consideration, it is desirable to employ the off-axis layout with the both surfaces of LaAlO₃ and Al₂O₃ targets 18 and 22 being tilted with respect to the Si wafer 12. Preferably the wafer-target angle θ is set to range from 70 to 110 degrees. This angle setting is preferable for the reasons which follow. If this angle θ becomes larger than 110 degrees, selective evaporation of aluminum due to high-energy beam of neutral oxygen being irradiated onto Si wafer 12 increases resulting in unwanted creation of defects in the LaAlO₃ film formed. On the contrary, if the angle θ is less than 70 degrees, the growth rate the LaAlO₃ film on wafer decreases, resulting in an increase in manufacturing costs.

Figure 9:
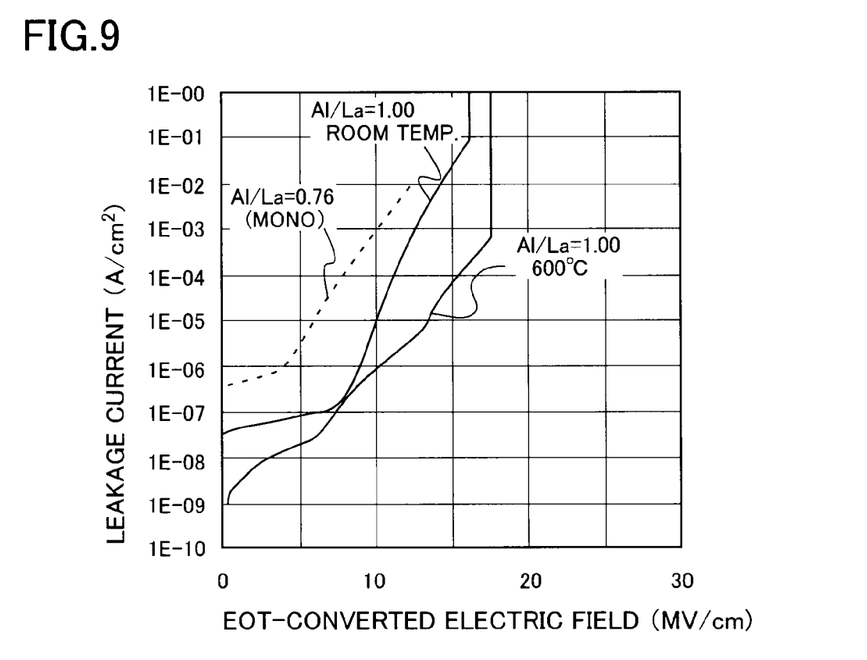

In the film forming conditions stated previously, the substrate or wafer temperature during sputter deposition is set at 600° C. This is because letting this temperature be higher than room temperature leads to suppression of leakage current as shown in FIG. 9. More generically, the wafer temperature may be set to range from 300 to 650° C. The reason of this is as follows. If the wafer temperature goes beyond 650° C., residual materials on Si wafer 12 are thermally driven into the LaAlO₃ film, resulting in changes in composition and structure of the film. If the wafer temperature becomes less than 300° C., the short-distance order of atoms fails to reach the aimed thermal motion energy for transition into the minimal energy state of perovskite structure, resulting in establishment of non-perovskite short-distance order, which causes the dielectric constant to become lower than that of the perovskite. To suppress lowering of the dielectric constant, setting the wafer temperature equal to or higher than 500° C. is more preferable. Additionally the short-distance order of atoms in LaAlO$_3$ film is of the coherence of about 2 nm at most, so whether the coherence is present or absent is not determinable by standard x-ray diffraction methods. However, by using extended x-ray absorption fine structure (EX-AFS) methods to observe the spectrum near an absorption end, it becomes possible to affirm not only a difference in short-distance atom order but also such difference due to a difference in wafer temperature.

Figure 10:
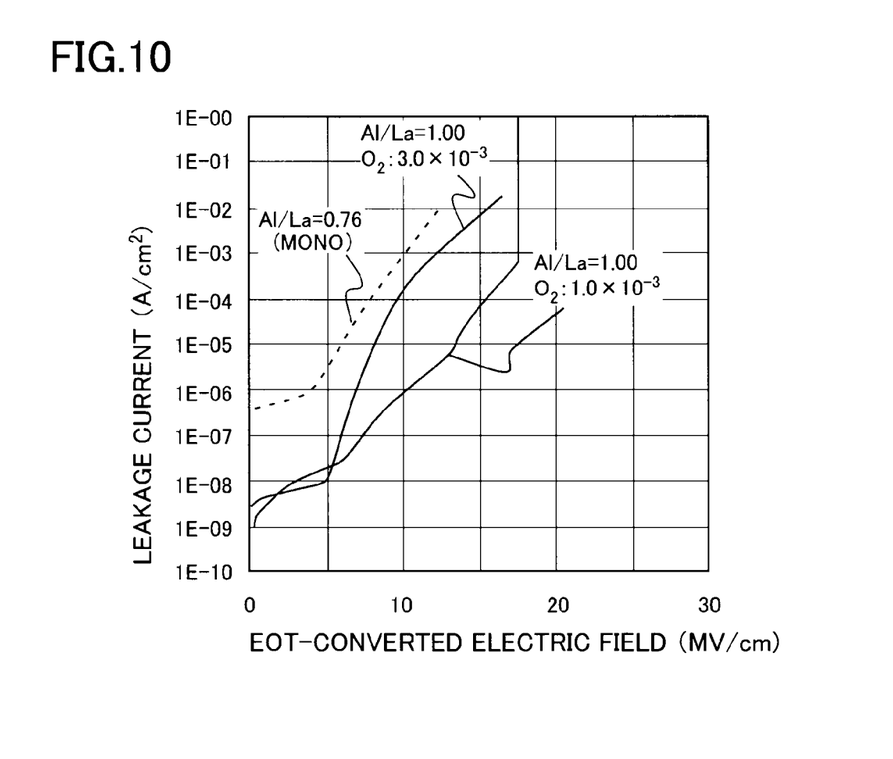

While in the film-forming process conditions the partial pressure of oxygen in the sputtering gas is set at $1.0\times10^{-3}$ Pa, this pressure may be more generically designed to range from $1.6\times10^{-6}$ to $3.0\times10^{-3}$ Pa. The reason of this is as follows. In case the oxygen's partial pressure is set at 0, the LaAlO$_3$ film formed can increase in leakage current especially when the wafer is at high temperatures. From a viewpoint of apparatus control, it is usually difficult to control an oxygen partial pressure of less than $1.6\times10^{-6}$ Pa with sputtering deposition. In addition, as shown in FIG. 10, the leakage current of LaAlO$_3$ film can increase when this pressure becomes higher than $1.0\times10^{-3}$ Pa also. Accordingly, if the oxygen partial pressure becomes higher than $3.0\times10^{-3}$ Pa then the above-noted advantage is lost as to the leakage current suppressibility of the cosputtering method of this embodiment over prior known mono-sputtering approaches. Additionally a curve of leakage current versus EOT electric field with the oxygen partial pressure set at $3.0\times10^{-3}$ Pa shown in FIG. 10 was obtained while changing this partial pressure only.

The increase in leakage current of LaAlO$_3$ film due to an increase in oxygen partial pressure is considered to have roots in the ratio of active species of the oxygen. More specifically, the oxygen receives mutual interaction of a plasma during film fabrication and thus exists in the form of molecules or ionized particles, such as $O_2$, $O_2^+$, $O_2^-$, $O^-$, $O_2^{2-}$, $O(^1D)$, and $O(^3P)$. Negative ions, such as $O_2^-$, $O^-$ and $O_2^{2-}$, have an increased momentum through high-speed acceleration by the sheath, which leads to the risk that defects are induced in the LaAlO$_3$ film on Si wafer as stated previously.

Regarding other particles such as $O_3$, $O(^1D)$, etc., these are extra-high in internal energy so that they are is active and high in efficiency of on-wafer LaAlO$_3$ film oxidation. On the contrary, the particles are kept low in momentum as far as they are not originated from $O^-$, $O_2^-$, nor $O_2^{2-}$, and are thus relatively less in risk of inducing defects in LaAlO$_3$ film. Therefore, appropriately setting the oxygen partial pressure contributes to the reduction of leakage current. However, when the oxygen partial pressure in the sputtering gas increases, active oxygen particles are made inactive by the interaction: $O(^1D)+O_2\rightarrow O(^3P)+O_2$, $O_3\rightarrow O(^1D)+O_2\rightarrow O(^3P)+O_2$. This results in a decrease in the ratio of $O_3$, $O(^1D)$ or else, i.e., the particle species preferable for sputter deposition of the LaAlO$_3$ film. Thus, it is considered that when the oxygen partial pressure becomes higher also, the LaAlO$_3$ film formed increases in leakage current. Note that the decrease in ratio of $O_3$, $O(^1D)$ tends to occur when the oxygen partial pressure is set to $1.0\times10^{-3}$ Pa or above.

In view of the phenomena stated above, in the LaAlO$_3$ film fabrication process of this embodiment, it is preferable from a viewpoint of leakage current reduction that the active oxygen, such as $O_3$ or $O(^1D)$, be fed directly from an active oxygen generator device to a location near the Si wafer 12 in the sputtering gas atmosphere.

Although in the process conditions listed the LaAlO$_3$ film growth rate is set at 0.025 nm/sec., it is preferable in a more generic sense to set it to fall within a range of from 0.0003 to 0.04 nm/sec. One reason of this is that setting the rate to less than 0.0003 nm/sec. makes it difficult to stably retain the plasma at or near the targets. To stabilize the plasma, use of a massive or "giant" vacuum chamber is required, resulting in a cost increase of the sputtering apparatus. Another reason is that the setup at such slow rate causes the fabrication process to decrease in efficiency. On the contrary, if the film forming rate exceeds the upper limit value of 0.04 nm/sec., electrical power required increases, resulting in a decrease in target use efficiency. This leads to an increase in production costs.

In the above-stated process conditions the wafer radius r is set to 150 mm whereas the minimum distance s1, s2 of each of the LaAlO$_3$ and Al$_2$O$_3$ targets 18 and 22 relative to Si wafer 12 is set at 100 mm. More generically, these values r and s1-s2 may be determined to satisfy: $r/2 \leq s1 \leq r+30$, and $r/2 \leq s2 \leq r+30$. With this value settings, it is possible to improve the inplane uniformity of LaAlO$_3$ film thickness.

The reason for this is as follows. If the minimum target-wafer distance s1 or s2 becomes larger than the value r+30, the LaAlO$_3$ film formed on Si wafer 12 can become thicker unintentionally at portions near the wafer edge under ordinary sputter deposition conditions. Adversely, if the distance s1, s2 becomes less than the value r/2, the on-wafer LaAlO$_3$ film usually becomes thicker at portions near the wafer center under ordinary sputtering conditions.

From a viewpoint of the film thickness uniformity, it is preferable to determine the values r, s1 and s2 to satisfy the above-stated relations; however, from viewpoints of increased sputter condition adjustability, apparatus malfunction reduction by structure simplification, and cost reduction by chamber downsizing and easiness of system design, it is recommendable to set the distance values s1 and s2 to satisfy: s1=s2=0 (mm).

In the above-listed process conditions the total pressure of the sputtering gas is set at 1.0 Pa. More generically this pressure may be set to range from 0.1 to 2.0 Pa. The reason of this is as follows. If the total gas pressure is less than 0.1 Pa, a plasma created can become less in stability with the use of standard charge-coupled sputter cathodes. If this pressure exceeds 2.0 Pa, sputtered particles can be shielded or "blocked" by the sputter gas, resulting in a decrease in film forming rate. Another risk is that the LaAlO$_3$ film formed deteriorates in leakage characteristics due to unwanted acceptance of impurities in the sputter gas.

In the process conditions listed, the degree of vacuum of chamber 10 prior to introduction of the sputtering gas is set at $1\times10^{-8}$ Pa. More generically this vacuum may be set to $8\times10^{-6}$ Pa or below—preferably, at $2\times10^{-8}$ Pa or less. The reason of this is as follows. If the chamber vacuum becomes greater than $8\times10^{-6}$ Pa, impurities can be mixed into the LaAlO$_3$ film at practical film-forming rates due to a deficient level of vacuum, resulting in a decrease in film dielectricity. As far as the vacuum is at $2\times10^{-8}$ Pa or less, such impurity mixture is effectively prevented, resulting in further improvement of dielectric characteristics of the LaAlO$_3$ film.

Although in the above-stated film forming conditions the spin rate of Si wafer 12 is set at 0.3 turns/sec., such wafer spinning may be eliminatable when the need arises. Note however that spinning wafer 12 makes it expectable to improve the inplane uniformity of LaAlO$_3$ film. Preferably, the wafer spin rate, Vs, may be set to satisfy: $1/t \leq Vs \leq 1082$, where t is the film growth time (sec.), that is, the time between a beginning of growth of the film on the substrate and an end of the growth of the film. It is also permissible to set the revolution or "go-around" speed Vo (turns/sec.) of the wafer to satisfy: $1/t \leq Vo \leq 1082$. More preferably, let Vs satisfy $3/r \leq Vs \leq 10$; similarly, let Vo satisfy $3/t \leq Vo \leq 10$.

The reason of this is as follows. If the wafer spin rate Vs and wafer revolution rate Vo are each less than 1/t, the wafer obviously fails to complete one turn within the film-forming time period. Thus, the $LaAlO_3$ film can become deficient in improvement of inplane uniformity. When wafer 12 is driven to perform three turns at least, the film is appreciably improved in inplane uniformity. Alternatively, if the rate Vs, Vo is in excess of 1082 (turns/sec.), physical or mechanical vibrations become stronger at air-contact portions of a rotatable shaft for transmission of a rotation torque to the vacuum chamber 10, thereby making it difficult to perform the intended film fabrication. Setting each rate Vs, Vo at 10 enables achievement of smooth wafer rotation, thus making it possible to perform the film fabrication with enhanced stability.

Figure 11:
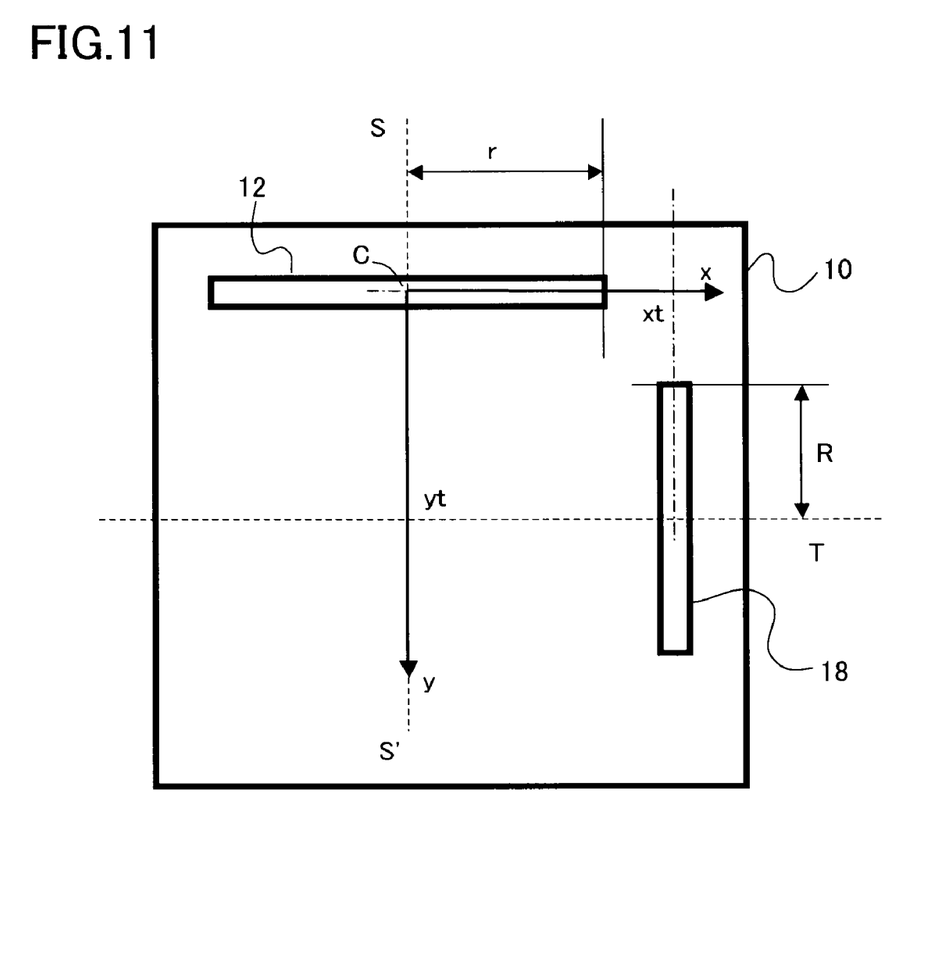
FIGS. 11 and 12 are diagrams depicting different sectional views of the vacuum chamber in the sputter tool of FIG. 1, for explanation of desired conditions as to rotation of the substrate.
Figure 12:
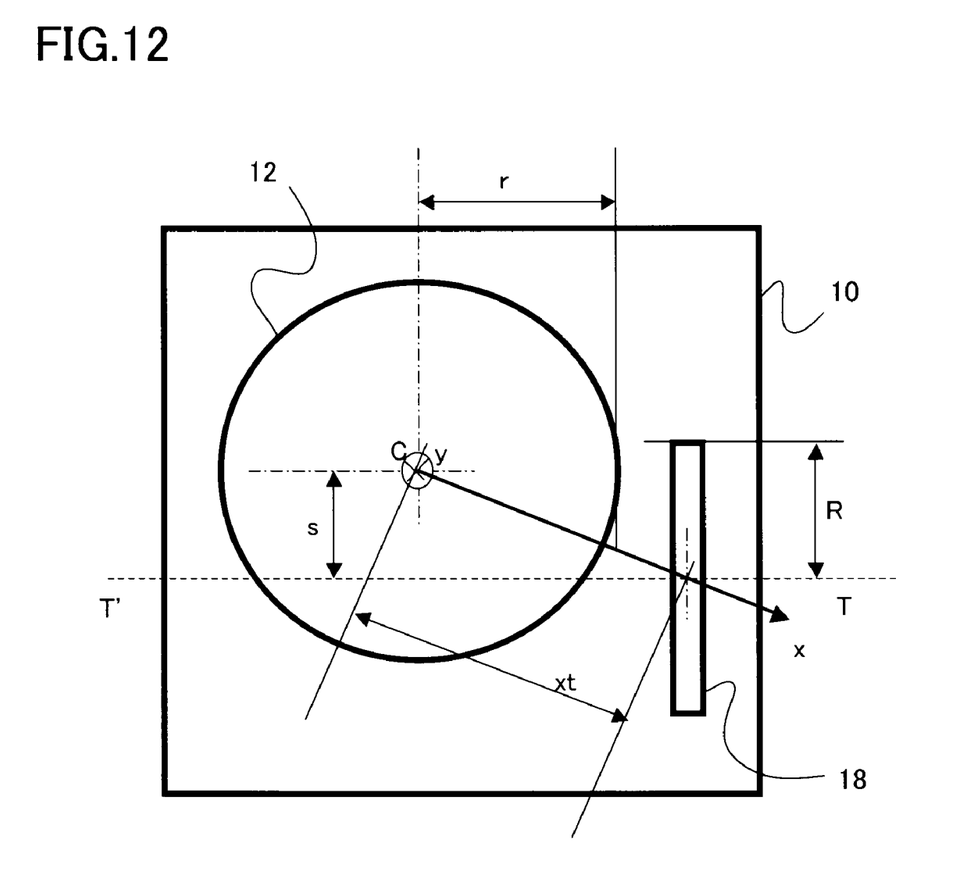

A detailed explanation will now be given of desired conditions as to the wafer-spin/rotation drive with reference to FIGS. 11 and 12 below. FIG. 11 is a pictorial representation of the vacuum chamber 10, which shows its cross-section at right angles to Si wafer 12 whereas FIG. 12 depicts a sectional view of chamber 10 in parallel to the wafer. Even where more than two wafer rotation shafts are provided, a locus or "orbit" of the rotating wafer's gravity point per se becomes a circle in shape. This will be called the locus circle. Define a straight line segment extending from a central point of this locus circle in a direction normal to a plane containing this circle, which line will be regarded as an overall or "global" rotation axis of Si wafer 12. Let the center of the locus circle be a global center C of wafer 12.

As shown in FIGS. 11-12, the x-axis and y-axis of an orthogonal coordinate system are defined with the global rotation center of Si wafer 12 being as the original point thereof. The x-axis is a straight line which is uniquely defined at a position whereat the wafer surface crosses a flat plane containing therein both the global rotation axis of wafer 12 and the gravity point of $LaAlO_3$ target 18. This x-axis extends in a direction along which a distance to the target 18's gravity point becomes less in value. The y-axis is a straight line extending in a direction along which the distance between Si wafer 12 and the target gravity point of target 18 in the global rotation axis direction becomes smaller.

With this x- and y-axes setting, the closer to the target, the larger the x/y-axis coordinate value (mm). In this x-y coordinate system, the gravity point of the $LaAlO_3$ target 18 is represented by a coordinate point (xt1,yt1), with its radius given by R1 (mm). Regarding the $Al_2O_3$ target 22, its gravity point is represented as (xt2,yt2); let its radius be R2. Let the radius of Si wafer 12 be r. At this time, $LaAlO_3$ target 18 is laid out to satisfy: $r \leq xt1$ and $R1+10 \leq yt1$. For $Al_2O_3$ target 22, let it satisfy: $r \leq xt2$ and $R2+10 \leq yt2$. This target positioning design is preferable for the reason which follows: if the value xt1 is less than r, the $LaAlO_3$ film fails to be uniformly formed on the wafer; if yt1 is less than R1+10 then $LaAlO_3$ film can "overflow" and is possibly formed on the backface of wafer 12 also. The same goes with the values xt2, yt2 and R2 of the other target 22.

In the above-listed process conditions the Ar gas is used as the sputtering gas. Other kinds of gases are alternatively employable, each of which contains a noble gas as its main component. Examples of the noble gas include but not limited to a krypton (Kr) gas, xenon (Xe) gas, neon (Ne) gas, and helium (He) gas. Note however that the use of Ar gas-based sputtering gas is preferable from a viewpoint of cost reduction in industrial applications.

Although in the illustrative embodiment the lanthanum aluminate ($LaAlO_3$) is used as one example of the lanthanoid aluminate film material, the lanthanum (La) may be replaced by any other element or elements as selected from the lanthanoid (Ln) group including cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) and yttrium (Y). In this case also, similar effects and advantages are obtainable.

Additionally, every lanthanoid aluminate ($LnAlO_3$) film fabricated has the perovskite structure. As aluminum (Al) is less in weight than Ln elements, Al is readily evaporated from the $LnAlO_3$ film. The selective Al evaporation is also facilitated by the fact that the boiling point of aluminum oxides is at 3000° C., which is lower than that of lanthanoid oxides. Accordingly, in the case of a mono-target made of $LnAlO_3$ being used, film composition deviation can take place as in the case of lanthanum (La). This composition deviation is curable by the cosputtering method using the lanthanoid aluminate ($LnAlO_3$) target and aluminum oxide ($Al_2O_3$) target at a time. Though sputter yields of lanthanoid increases from the minimum atomic number of lanthanum (La) to maximum atomic number of lutetium (Lu), this fact decreases Al/Ln ratio with sputtering from mono-target of $LnAlO_3$ furthermore. Therefore cosputtering is more effective in these cases.

The composition is adjustable by varying the ratio of RF power applied to $LaAlO_3$ target 18 and RF power to $Al_2O_3$ target 22. For example, for several samples prepared while changing the target-applied RF power ratio, analyze composition changes of these samples by inductively coupled plasma (ICP) spectrometry or like techniques, thereby to quantitatively determine an optimal RF power ratio. Other film sputter deposition process conditions are determinable depending on the physical or chemical nature of the lanthanoid element used. Thus, in the case of lanthanoid aluminate ($LnAlO_3$) films other than the $LaAlO_3$ film also, similar process conditions to those of $LaAlO_3$ film fabrication are employable. This can be said because lanthanoid elements are similar in chemical properties to one another.

Although the invention has been disclosed and illustrated with reference to a particular embodiment, the principles involved are susceptible for use in numerous other embodiments which will be apparent to persons skilled in the art. While in the description above those parts of the lanthanoid aluminate film fabrication method and apparatus which are deemed not to be directly related to the principal concept of the invention are not specifically described, it would readily occur to skilled persons that these may be arranged and designed by selective use of currently known elements of such method and apparatus in a known way. The invention is, therefore, to be limited only as indicated by the scope of the appended claims.

What is claimed is:

1. A lanthanoid aluminate film fabrication method comprising:
holding within a vacuum chamber a first target made of lanthanoid aluminate ($LnAlO_3$) and a second target made of aluminum oxide ($Al_2O_3$);
conveying a substrate into the vacuum chamber;
introducing a sputtering gas into the vacuum chamber; and
sputtering the first and second targets to thereby form a lanthanoid aluminate film on the substrate.

2. The method according to claim 1, wherein the lanthanoid aluminate film has a molar ratio of aluminum (Al) to lanthanoid (Ln) falling within a range of from 0.98 to 1.19.

3. The method according to claim 1, wherein the lanthanoid aluminate film ranges from 0.98 to 1.02 in molar ratio of Al to Ln.

4. The method according to claim 1, wherein the first and second targets are placed while causing an angle of a surface of the substrate formed with a surface of the each target to range from 70 degrees to 110 degrees.

5. The method according to claim 1, wherein during the sputtering the substrate is set at a temperature ranging from about 300° C. to about 650° C.

6. The method according to claim 1, wherein the sputtering gas contains therein an oxygen having a partial pressure ranging from $1.6 \times 10^{-6}$ Pa to $3.0 \times 10^{-3}$ Pa.

7. The method according to claim 1, wherein the lanthanoid aluminate film is formed at a rate ranging from 0.0003 nanometers per second (nm/sec) to 0.04 nm/sec.

8. The method according to claim 1, wherein the lanthanoid aluminate ($LnAlO_3$) is a lanthanum aluminate ($LaAlO_3$).

9. The method according to claim 1, wherein the first and second targets are laid out to satisfy a relation of $r/2 \leq s1 \leq r+30$ and $r/2 \leq s2 \leq r+30$, where r (unit is millimeters or "mm") is a radius of the substrate, s1 (in mm) is a minimal distance between a line segment passing through a gravity point of the substrate and extending at right angles to a surface of the substrate and a line segment passing through a gravity point of the first target and extending at right angles to a surface of the first target, and s2 (mm) is a minimal distance between the line segment passing through the gravity point of the substrate and extending at right angles to the surface of the substrate and a line segment passing through a gravity point of the second target and extending at right angles to a surface of the second target.

10. The method according to claim 1, wherein the sputtering gas has a total pressure ranging from 0.1 Pa to 2.0 Pa.

11. The method according to claim 1, wherein prior to introduction of the sputtering gas, the vacuum chamber has a degree of vacuum of less than or equal to $2 \times 10^{-8}$ Pa.

12. The method according to claim 1, further comprising:
rotating the substrate during the sputtering.

13. The method according to claim 12, wherein the substrate is rotated while satisfying any one of a relation of $1/t \leq Vs \leq 1082$ and a relation of $1/t \leq Vo \leq 1082$, where Vs is a spin speed of the substrate (turns per second), Vo is an orbital speed of the substrate (turns per second), and t is a growth time (seconds) for fabrication of the lanthanoid aluminate film.

14. The method according to claim 1, further comprising:
supplying any one of $O_3$ and $O(^1D)$ into the sputtering gas from an active oxygen generating device.

15. The method according to claim 1, wherein the sputtering gas contains an argon (Ar) gas as its main component.

* * * * *